(12) United States Patent
Aydelott

(10) Patent No.: US 6,249,953 B1
(45) Date of Patent: Jun. 26, 2001

(54) METHOD FOR ASSEMBLING PORTIONS OF A PULLING CHAMBER

(75) Inventor: Richard M. Aydelott, Vancouver, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/560,953

(22) Filed: Apr. 28, 2000

Related U.S. Application Data

(62) Division of application No. 08/944,930, filed on Oct. 2, 1997, now Pat. No. 6,115,903.

(51) Int. Cl.[7] .................................................. B23Q 3/00
(52) U.S. Cl. ............................................. 29/464; 117/208
(58) Field of Search ................................. 29/464, 281.1, 29/281.5; 117/208; 414/399, 391

(56) References Cited

U.S. PATENT DOCUMENTS 4,350,560    9/1982    Helgeland et al. .

5,373,805    12/1994    Takano et al. .

FOREIGN PATENT DOCUMENTS

10158091  *  6/1998    (JP) ...................................... 117/208

* cited by examiner

*Primary Examiner*—S. Thomas Hughes
*Assistant Examiner*—Jermie E. Cozart
(74) *Attorney, Agent, or Firm*—Alston & Bird LLP

(57) ABSTRACT

A method of assembling portions of a pulling chamber of a semiconductor crystal growing machine is provided. A tension-bearing member is initially lowered to extend within and through at least a part of a pulling chamber and through a purge tube located below the pulling chamber. The tension-bearing member is attached to a purge tube-engaging device and the tension-bearing member is then raised to carry the purge tube upon the purge tube-engaging device. The purge tube can thereby be raised into a desired position within the pulling chamber. While the purge tube is raised, a purge tube holding ring can be installed within the pulling chamber and the purge tube can thereafter be lowered into an operative position during which the purge tube is supported by the purge tube holding ring.

6 Claims, 12 Drawing Sheets

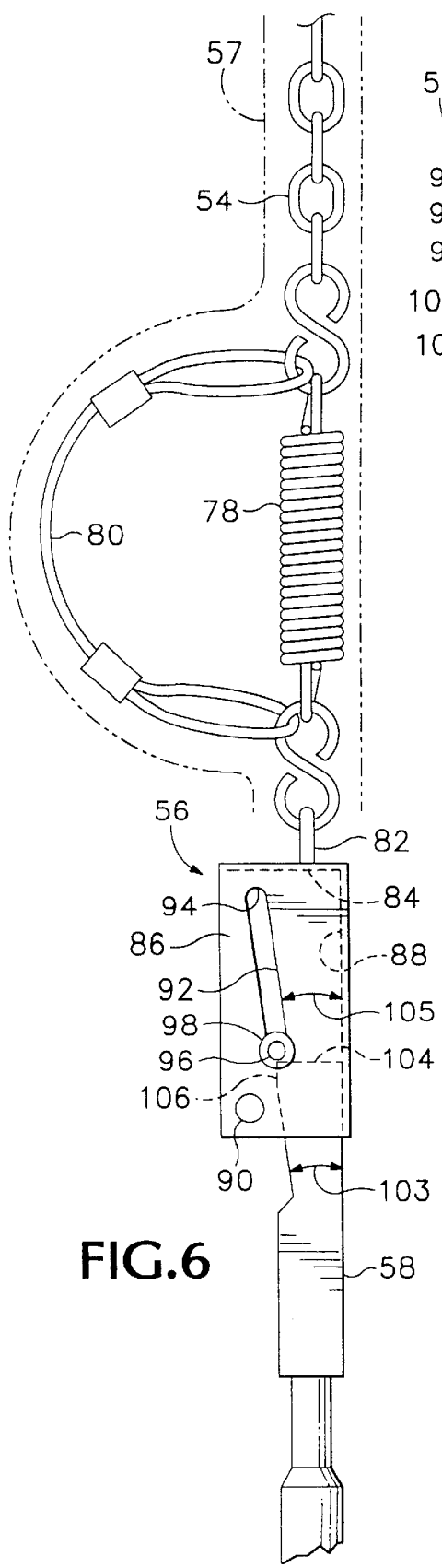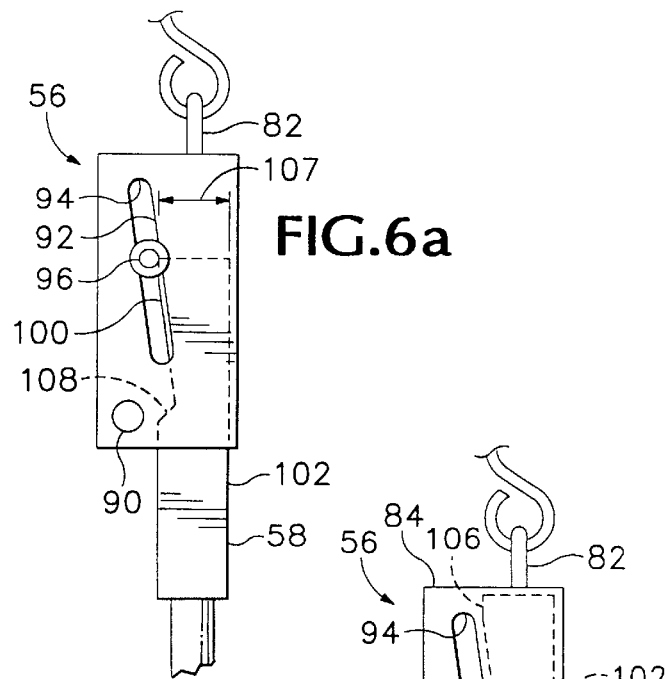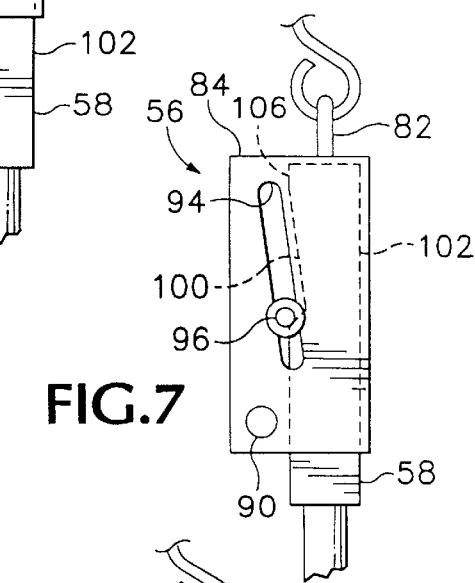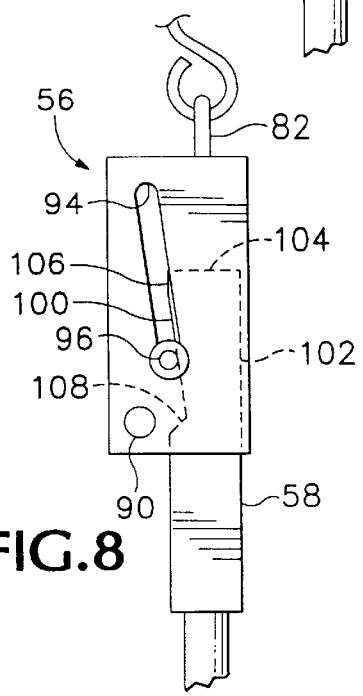

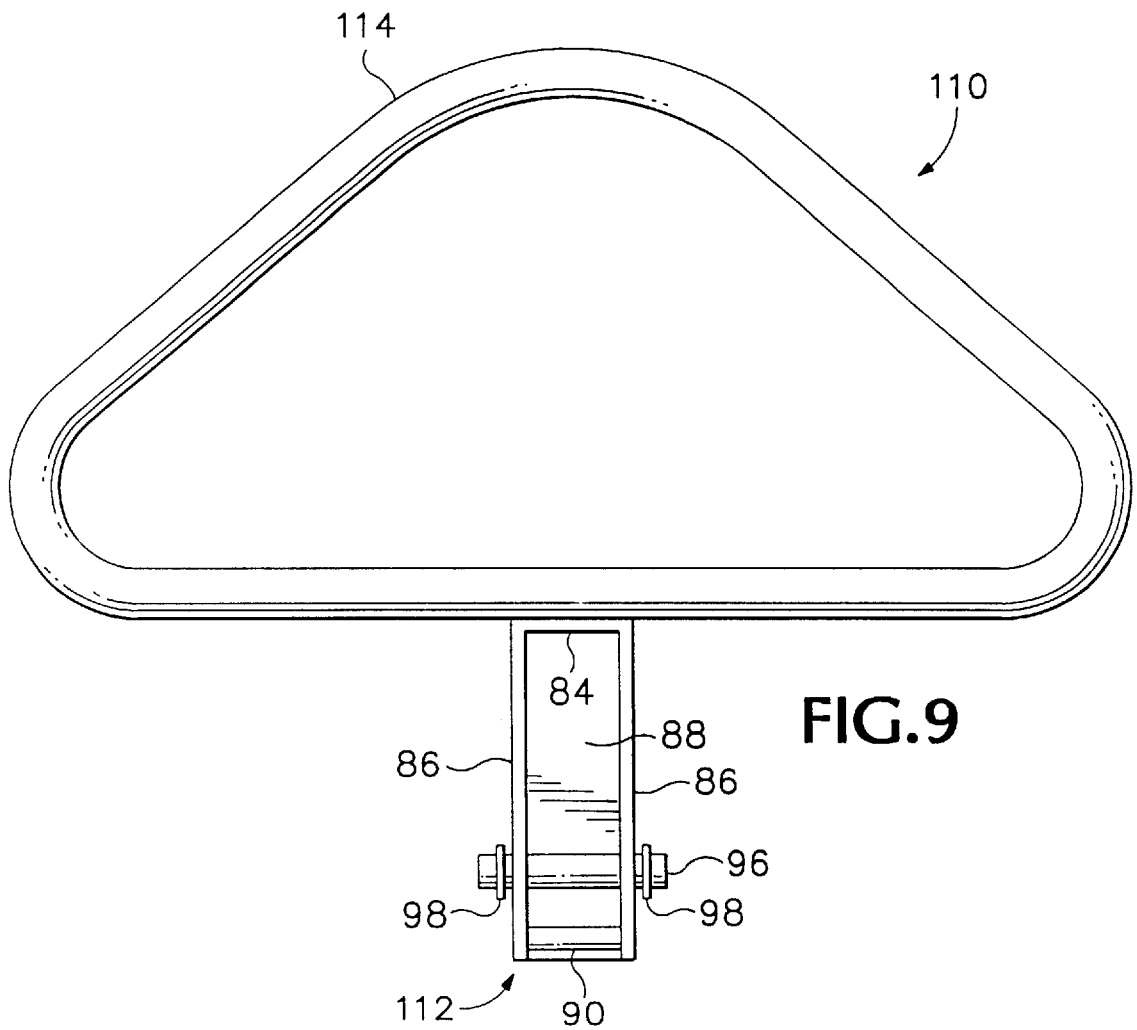

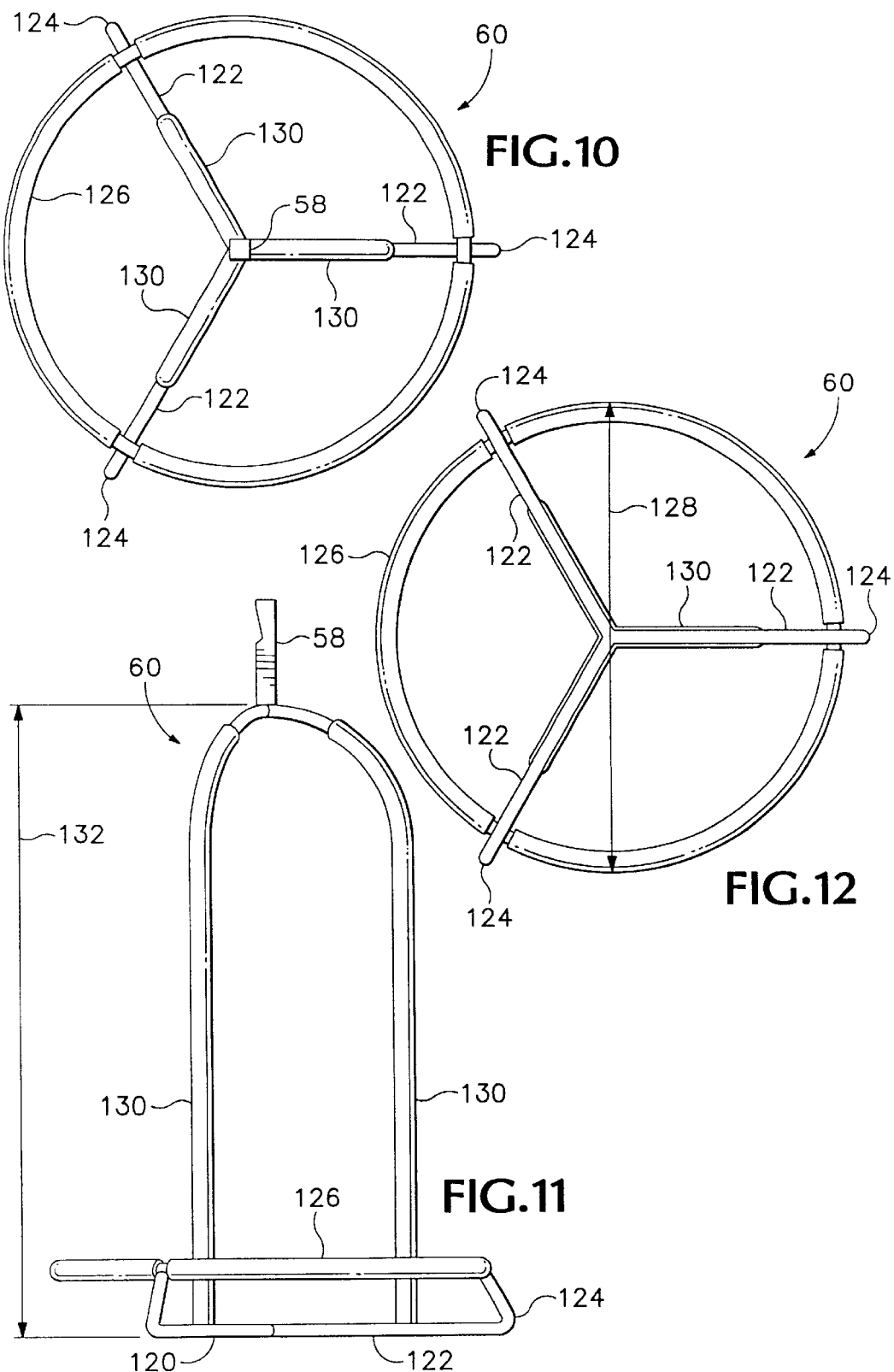

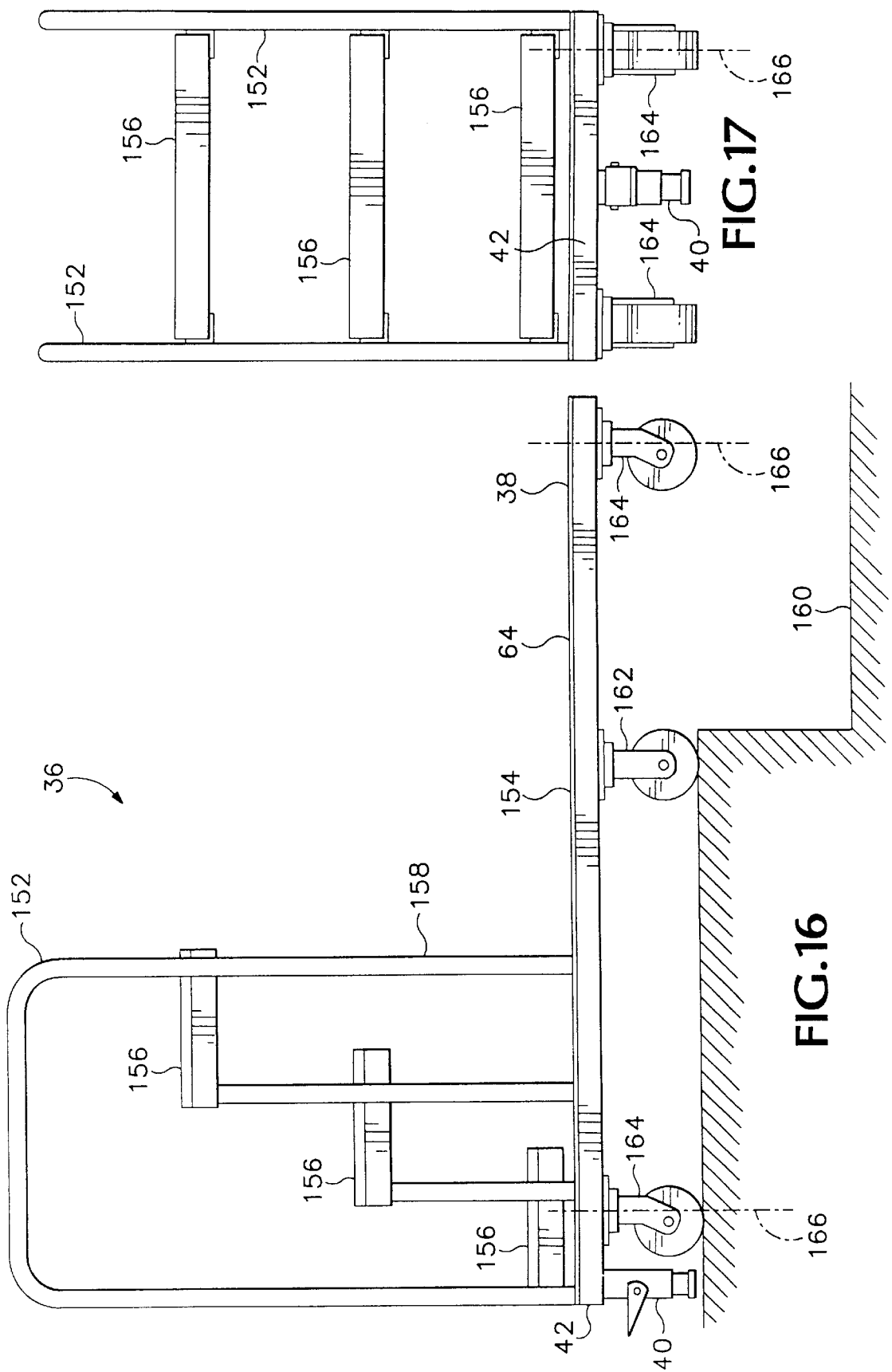

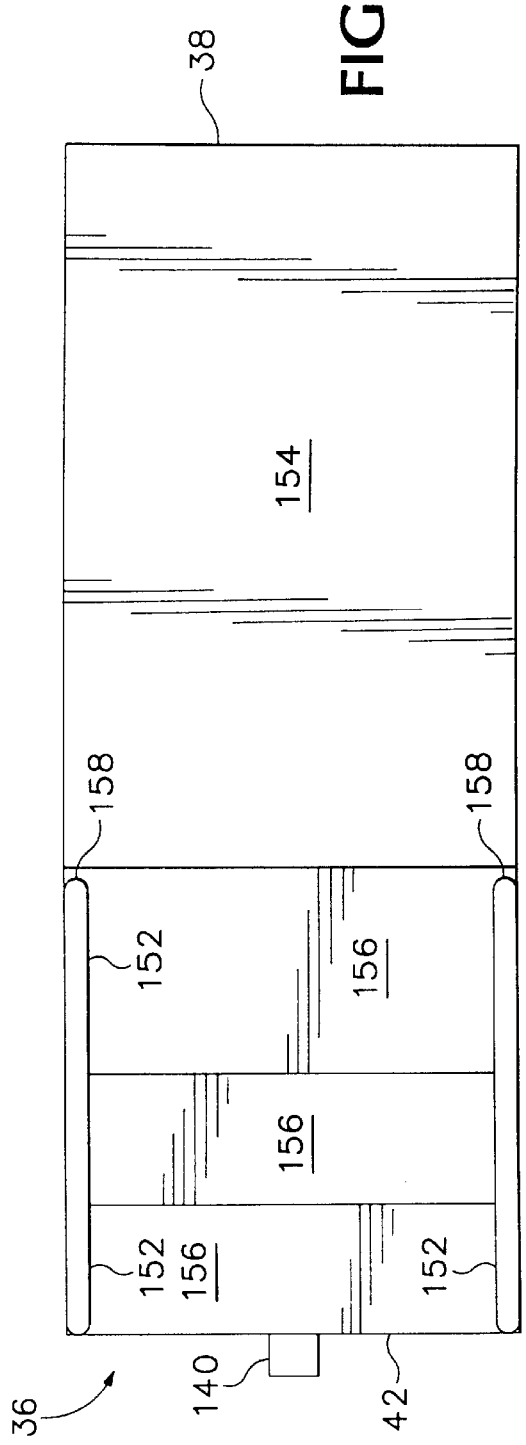
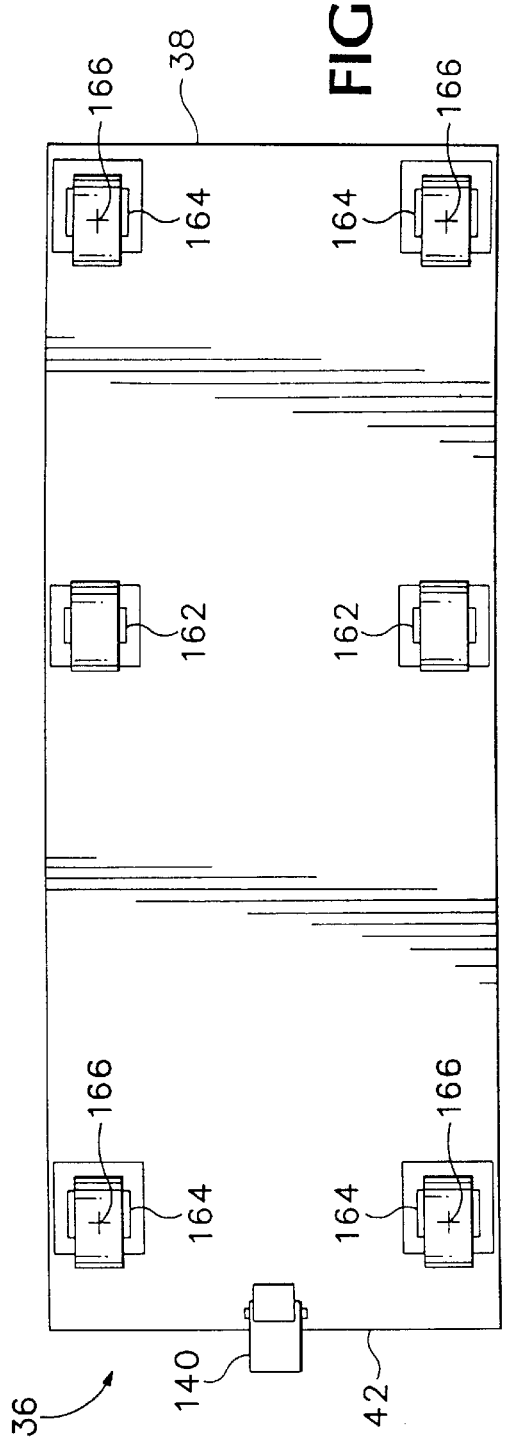

METHOD FOR ASSEMBLING PORTIONS OF A PULLING CHAMBER

RELATED APPLICATION

This application is a divisional of U.S. patent application Ser. No. 08/944,930, filed Oct. 2, 1997 U.S. Pat. No. 6,115,903, entitled PURGE TUBE REMOVAL AND REPLACEMENT.

BACKGROUND OF THE INVENTION

The present invention relates to manufacture of semiconductor crystals and in particular to maintenance of pulling chambers of crystal-growing machines.

Semiconductor crystals are formed in machines including furnaces in which the semiconductor material is liquified. Each machine includes a pulling chamber several feet high, located above the furnace. Crystals are gradually pulled upward through the pulling chamber from melted semiconductor material. Concentric gas flow areas are defined in the pulling chamber, and a purge tube and parts related to such gas flow areas periodically need to be removed from the pulling chamber, cleaned, and replaced.

In the past, pulling chamber components have been disassembled, removed, and replaced by lifting each part by hand. Some of these parts, however, are of costly, fragile, or brittle materials such as graphite. With technology developing to permit and make it desirable for larger crystals to be formed, purge tube parts have become large enough and heavy enough that it is difficult for a single person to handle the pulling chamber components safely. As a result, the risk of damage to parts of a pulling chamber or of injury to the personnel working with such parts has increased. What are needed, then, are tools for use in handling certain parts of a semiconductor crystal growing machine, and an improved method for handling such parts safely and conveniently.

SUMMARY OF THE INVENTION

The present invention supplies an answer to the above-identified needs by providing a specialized cart, a connector system, and tools which can be connected conveniently to a lifting chain, cable, or similar tension-carrying member controlled by a hoist, and a method for disassembly, removal of parts, and reassembly of a purge tube portion of a pulling chamber of a semiconductor crystal-growing machine.

The method of the present invention for handling portions of a pulling chamber of a semiconductor crystal-growing machine includes the steps of attaching a tension-carrying member to a purge tube ring removal tool, raising the ring removal tool into engagement with a purge tube ring, releasing the purge tube ring from the pulling chamber, and extending the tension-carrying member to lower the ring removal tool and purge tube ring beneath the pulling chamber.

Other aspects of the method of the invention may include steps of using a purge tube-engaging device to engage a purge tube, raising the purge tube-engaging device and the purge tube together within the pulling chamber, and removing a purge tube holding ring from the pulling chamber while holding the purge tube in an elevated position.

The method according to the invention may also include a step of lowering a purge tube ring removal tool carrying a purge tube ring onto a cart located beneath the pulling chamber.

Yet another aspect of a method according to the present invention may include the step of engaging a purge tube holding ring at two opposite locations on a bottom surface of the purge tube holding ring by using a purge tube holding ring removal tool, and supporting the purge tube holding ring with such a tool while removing it from the pulling chamber.

The present invention provides an easily operated connector for attaching a tension-carrying member such as a hoist cable to an object to be lifted. Such a connector includes a latch pin disposed slidably in a pair of inclined slots defined in side walls of a receptacle. The slots are inclined downward and rearward toward a rear wall of the receptacle so that the latch pin moves along the slots to grasp a tapered finger attached to the top of an object to be lifted when the receptacle is placed on the finger. Upward force applied to the receptacle results in the latch pin being urged into tighter engagement against the tapered finger, yet the connector is easily released by moving the receptacle downward relative to the tapered finger and moving the latch pin upward and away from the rear wall of the receptacle.

The present invention also provides a ring tool including a horizontal support ring carried by a structure including upwardly-extending legs located within the area circumscribed by the horizontal support ring, thus centralizing a tubular part such as a purge tube ring. The tool thus safely carries such a tubular part safely, centering it about the legs and within the horizontal support ring.

Preferably, parts of such a tool are covered by a heat-resistant cushioning material.

The invention also provides another tool for handling a tubular item within a limited space. Such a tool includes a pair of legs each having a respective foot attached to a lower end thereof, with upper ends of the legs being interconnected with each other by a resilient member. A flexible tension-bearing member is preferably attached to the tool at two spaced-apart locations near the upper ends of the legs, where it can be used to pull the feet closer together to permit the tool to be passed through a tubular or annular item. Thereafter, tension can be relaxed to allow the feet to move apart beneath the tubular or annular item to engage and support or lift it.

Another aspect of the present invention provides a specially adapted cart for use during assembly or disassembly of a pulling chamber of a semiconductor crystal-growing machine. The cart has a deck supported by wheels of which at least some are able to swivel to permit the cart to be moved easily, into a desired location. The cart also includes at least one jack to engage a surface beneath the cart to hold the cart in a required location. The cart according to one embodiment of the present invention may also include a set of steps rising above the deck to support a person assembling or disassembling the pulling chamber. In a preferred embodiment of the invention such a cart may include one or more handrails located adjacent such a set of steps, for use by a person assembling or disassembling a pulling chamber.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 6 is a side view of a receiver and a connection fixture which are parts of a quickly-releasable connector mechanism according to the present invention.

FIG. 6a is a side view of the receiver and connection fixture shown in FIG. 6 with the receiver moved further onto the connection fixture.

FIG. 7 is a side view of the receiver shown in FIG. 6 with the receiver fully lowered onto the connection fixture FIG. 8 is a side view of the receiver shown in FIG. 6 raised from the position shown in FIG. 9 to engage the connection fixture.

FIG. 9 is a front view of a receiver similar to that shown in FIGS. 6, 7, and 8, equipped with a handle for use in carrying objects by hand.

FIG. 10 is a top plan view of a purge tube ring removal tool according to the present invention.

FIG. 11 is a side elevational view of the purge tube ring removal tool shown in FIG. 10.

FIG. 12 is a bottom view of the purge tube ring removal tool shown in FIGS. 10 and 11.

FIG. 16 is a side elevational view of the cart shown in FIGS. 1–5, at an enlarged scale.

FIG. 17 is an end view of the cart shown in FIG. 16.

FIG. 18 is a top plan view of the cart shown in FIGS. 16 and 17.

FIG. 19 is a bottom plan view of the cart shown in FIGS. 10–18 showing the arrangement and attachment of wheels to the cart.

DETAILED DESCRIPTION OF THE PREFERRED EMBODIMENT

Figure 1:
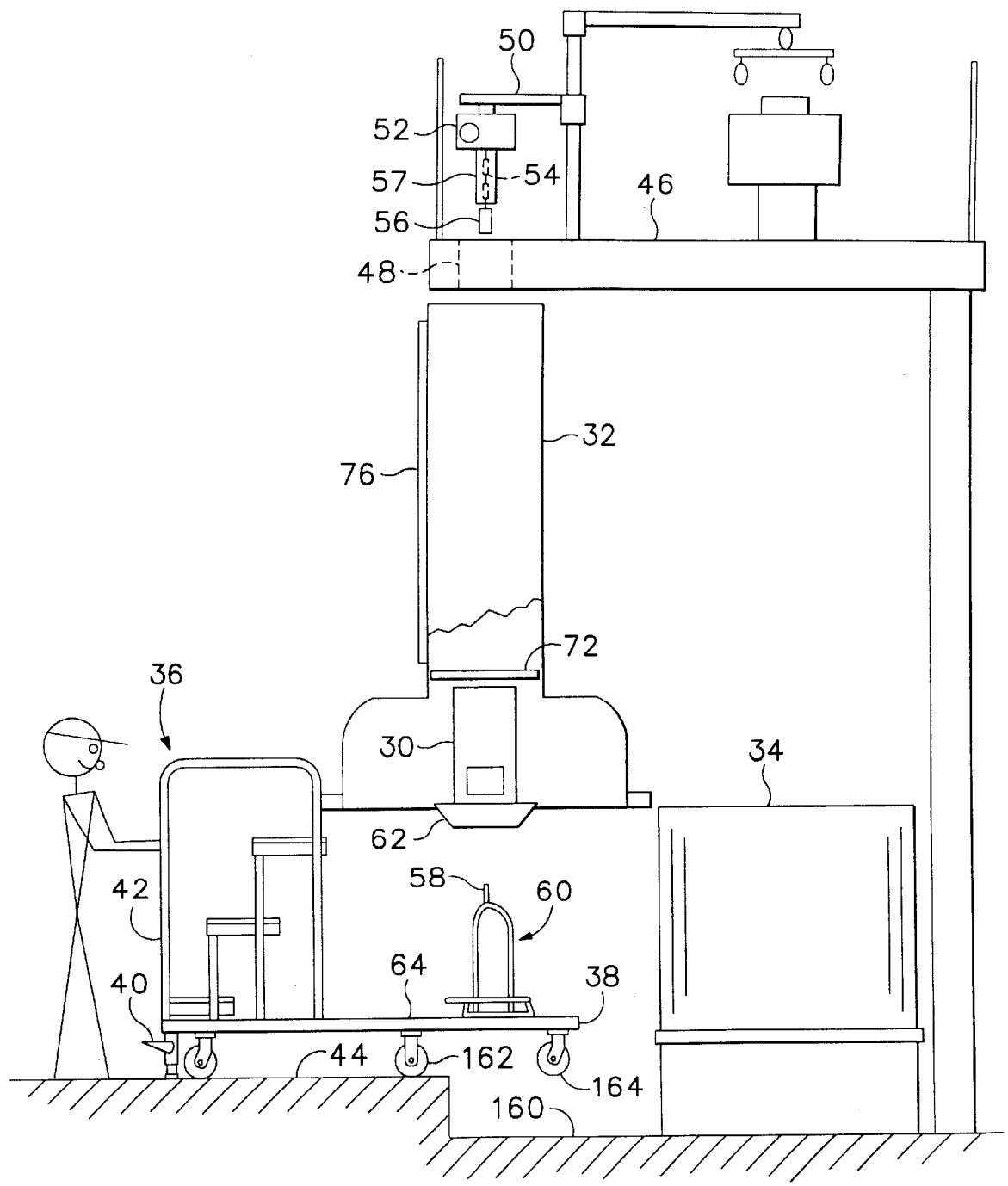
FIG. 1 is a simplified pictorial view of a first step of preparation for removal of a purge tube from a crystal pulling chamber.
Figure 2:
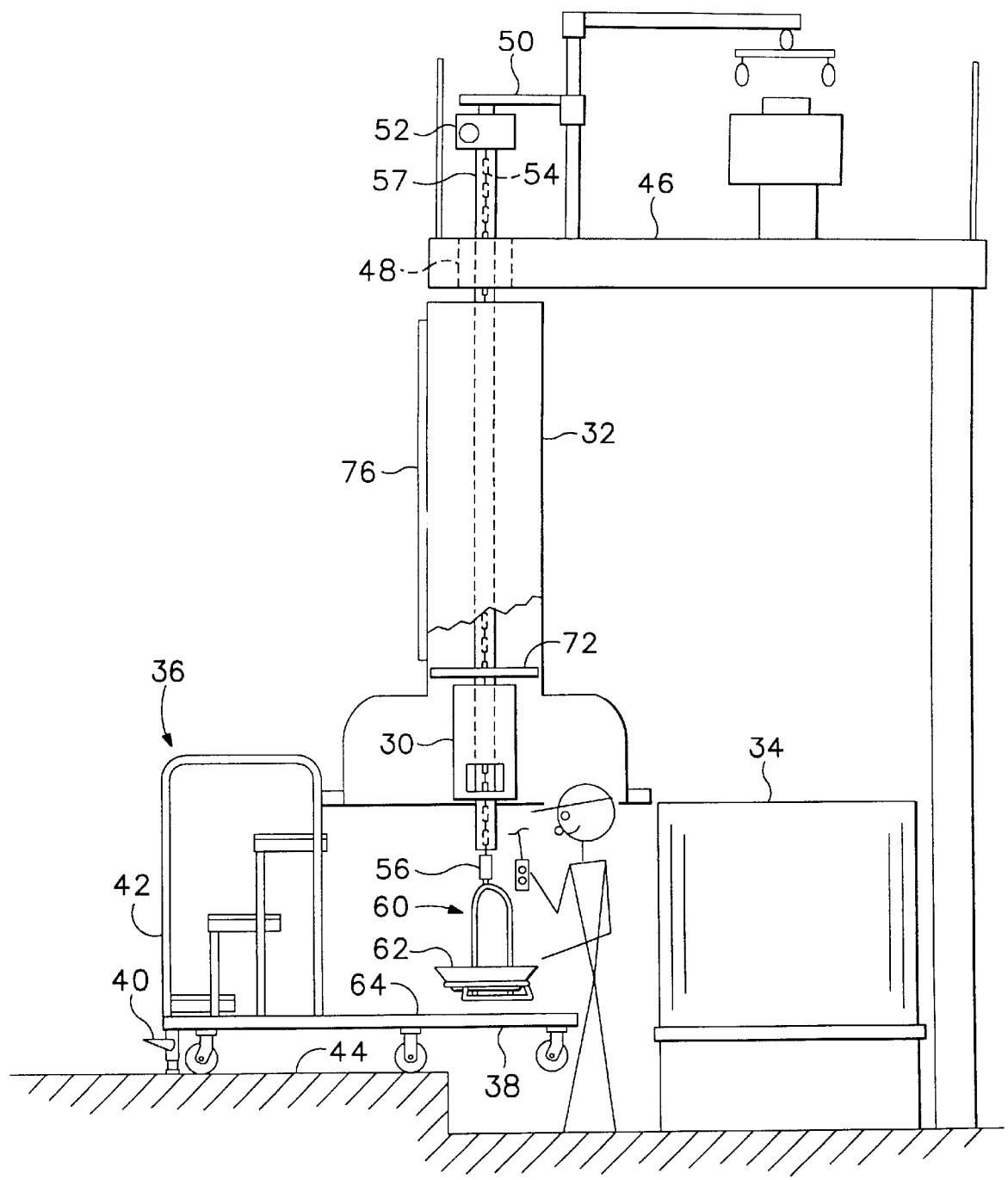
FIG. 2 is a simplified pictorial view of part of a step of removal of a purge tube ring from a pulling chamber using a ring removal tool according to the present invention.

Referring now to the drawings which form a part of the disclosure herein, and in particular to FIGS. 1–5, in accordance with the present invention a purge tube 30 is removed from a crystal pulling chamber 32 by first moving the pulling chamber 32 laterally to a service position from its operational position above the furnace 34 of a crystal-growing machine, using the conventional equipment. A special cart 36 is then placed where its load-carrying front end 38 is located beneath the pulling chamber 32. A jack 40 which may be located near the rear end 42 of the cart 36 is then operated to engage the floor 44 on which the cart 36 is resting, in order to prevent the cart 36 from moving from its desired position.

An upper deck 46 associated with the crystal-growing machine includes an opening 48 above the laterally removed or service position of the pulling chamber 32, as shown in FIG. 1, and a jib boom 50 is supported above the upper deck 46 in a position permitting it to carry a chain hoist 52 or similar hoisting device, preferably electrically powered and remotely controllable, in such a position that a tension-bearing flexible elongate member such as a chain 54 or a cable of suitable strength can be lowered downwardly through the pulling chamber 32 and centrally through the purge tube 30. A female receptacle 56, called a receiver, part of a connecting mechanism, is carried on the lower end of the chain 54. In order to preserve the cleanliness of the pulling chamber 32 the chain 54 is covered by an extensible cover 57 such as a bellows of flexible thin material to prevent lubricants and metal particles from the chain 54 from being deposited in the pulling chamber 32.

When the chain 54 is extended downward far enough the receiver 56 is coupled, as will be explained in greater detail presently, with a connection fixture 58 in the form of a tapered finger which is fixedly connected to the top of a purge tube ring removal tool 60 shown in greater detail in FIGS. 10, 11, and 12.

Next, the hoist 52 is operated to raise the purge tube ring removal tool 60 into position beneath and in supporting contact with the bottom of the purge tube ring 62, a short frusto-conical cylindrical tube having a length, or height, of several inches and an inside diameter greater than the outside diameter of the purge tube 30. The purge tube ring 62 is normally suspended within the lower portion of the pull chamber, and in one type of crystal growing machine the purge tube ring 62 is released from that position by being rotated about its vertical axis through a required angle, freeing the ring 62 to be lowered. With the purge tube ring removal tool 60 in place against the bottom end of the purge tube ring 62 the purge tube ring 62 is rotated or otherwise manipulated as required to release it from the structures supporting it within the lower end of the pulling chamber 32. Thereafter, with the purge tube ring 62 supported by the purge tube ring removal tool 60, the hoist 52 is operated to extend the chain 54, lowering the purge tube ring removal tool until it rests on the top of the deck 64 at the front end 38 of the cart 36. As will be explained in greater detail presently in connection with describing the purge tube ring removal tool, the purge tube ring removal tool 60 is constructed to support the purge tube ring 62 securely and to hold it in a position which will facilitate disconnecting or connecting the purge tube ring 62 to the portions of the pulling chamber which ordinarily support it during operation of the crystal-growing machine.

Once the purge tube ring 62 has been released and lowered onto the cart 36, the receiver 56 is manipulated to release the connection fixture 58. The hoist 52 is then operated to raise the chain 54 and the receiver 56 to a distance above the purge tube ring removal tool 60, and the receiver 56 is then coupled to a similar connection fixture 58 attached to a purge tube-engaging device 70 shown in greater detail in FIGS. 20 and 21. The hoist 52 is then operated to raise the receiver 56 and the attached purge tube-engaging device 70 inside the purge tube. The purge tube-engaging device 70 is rotated when it reaches the required height with respect to the purge tube 30, to engage the purge tube 30 so that further raising of the receiver 56 and the purge tube-engaging device 70 raises the purge tube 30 above its operational position, as shown in FIG. 3.

Figure 3:
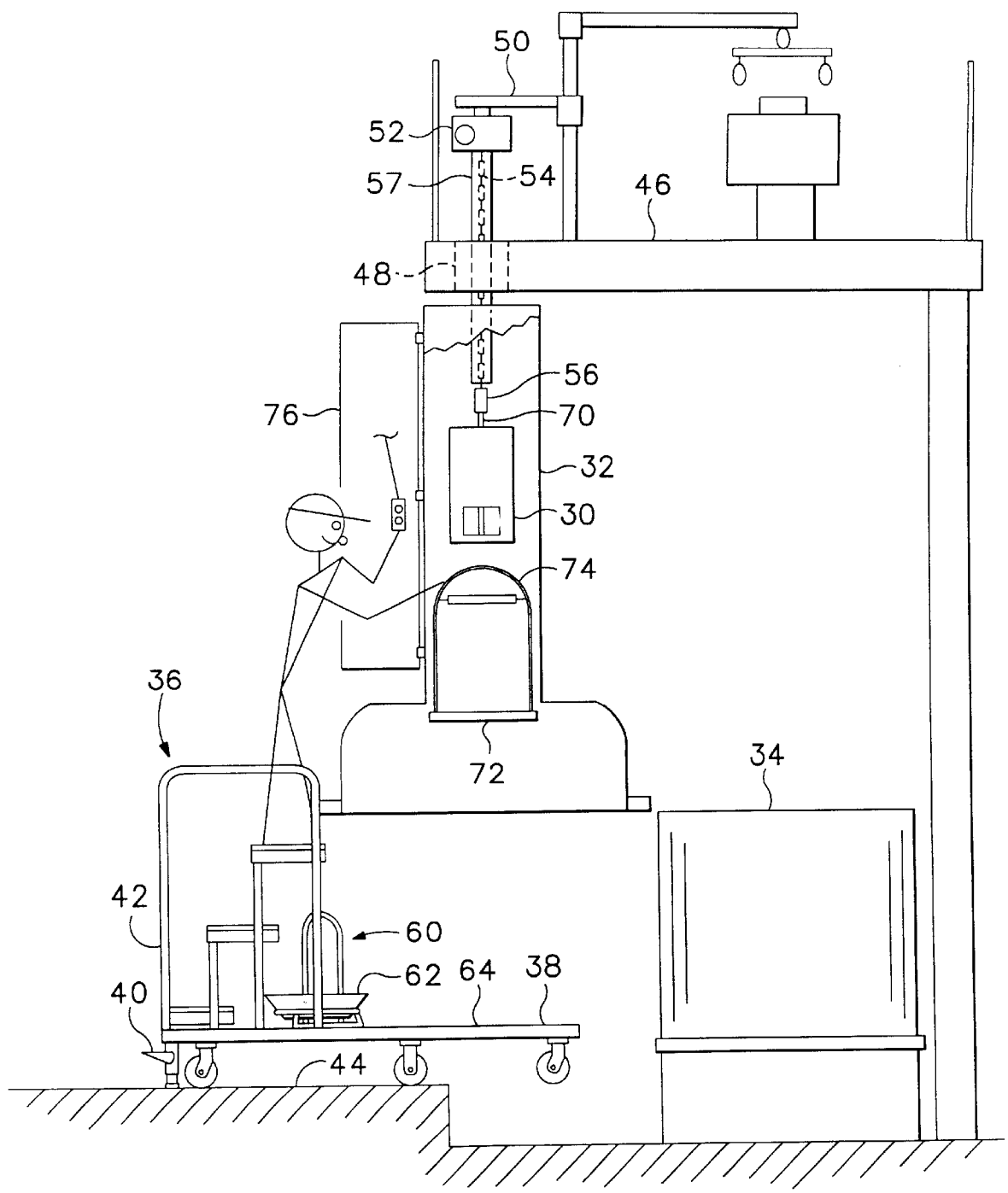
FIG. 3 is a simplified pictorial view of a step of removing a purge tube support ring from a pulling chamber.
Figure 4:
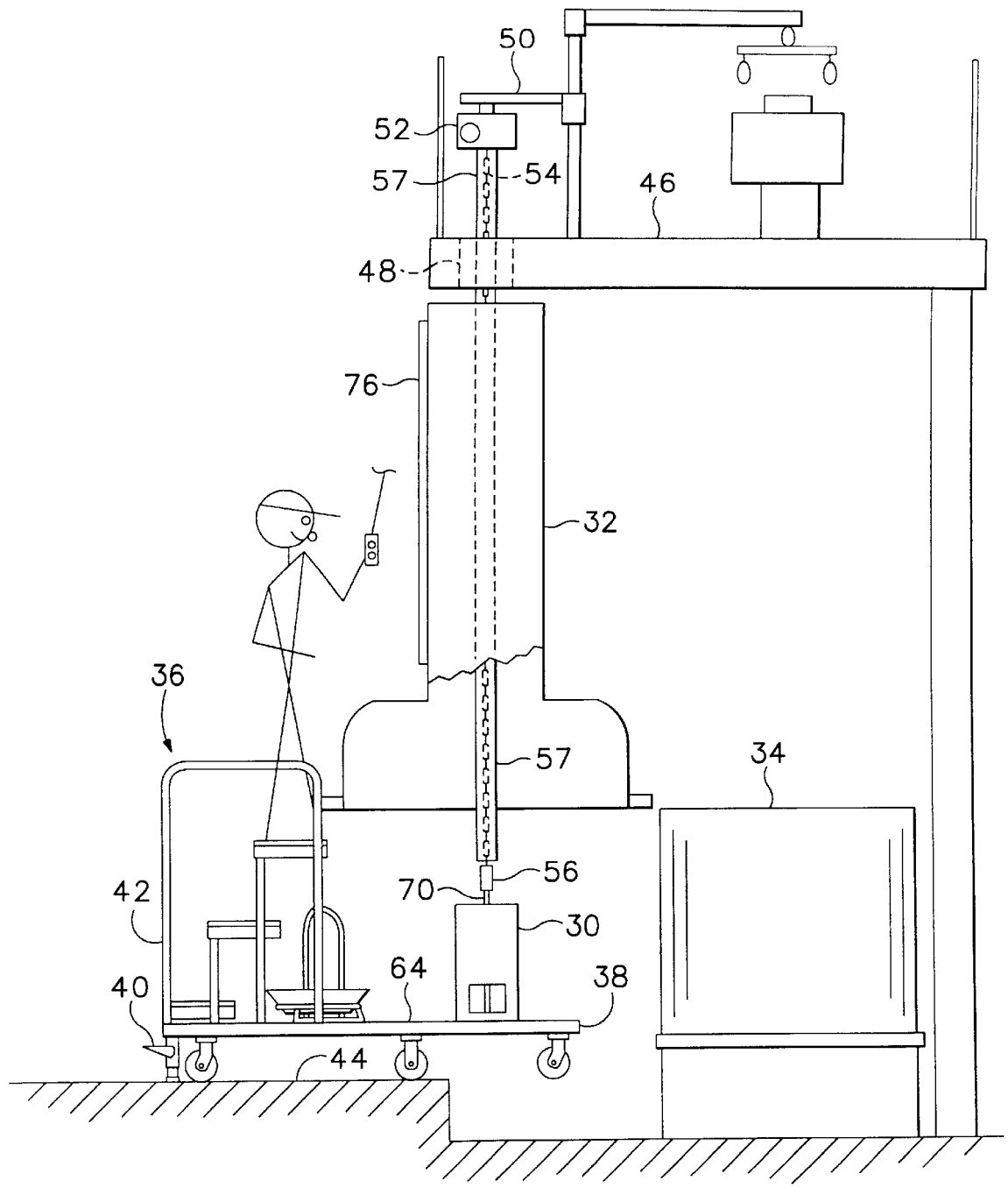
FIG. 4 is a simplified pictorial view showing the step of lowering a purge tube from the pulling chamber in accordance with the present invention.

The purge tube 30 is raised thus to a height sufficient to provide ample clearance above the purge tube holding ring 72, where the purge tube 30 is held temporarily suspended on the chain 54, while the purge tube holding ring removal tool 74 is used to remove the purge tube holding ring 72 from its normal position near the bottom end of the pulling chamber 32, as shown in FIG. 3. The purge tube holding ring 72 normally rests on a radially inwardly projecting shelf at the bottom of the pulling chamber 32 and extends radially inward far enough to engage a radially outwardly projecting lip of the purge tube 30 to support the purge tube 30 in its operational position within its pulling chamber 32. The purge tube holding ring removal tool 74 is attached to the purge tube holding ring 72, and then is used to raise the holding ring 72 until it can be removed from the pulling chamber laterally when the pulling chamber door 76 is open, giving access into the interior of the pulling chamber 32. Once the purge tube holding ring 72 has been removed as described there is sufficient clearance to lower the purge tube from within the pulling chamber 32 to the deck 64 of the cart 36 as shown in FIG. 4, by operating the hoist 52 to extend the chain 54 and lower the receiver 56 to which the purge tube-engaging device 70 remains connected.

Figure 5:
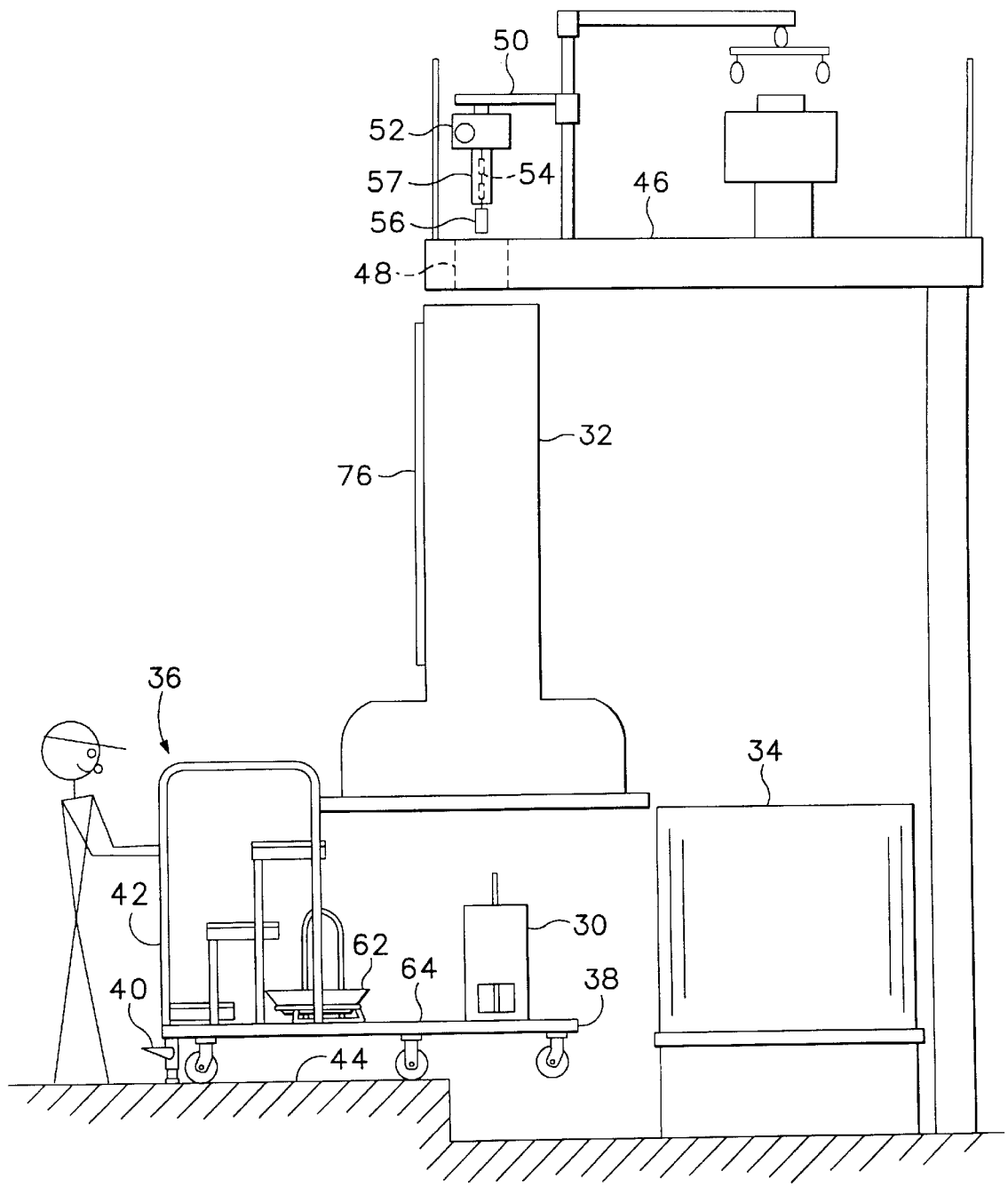
FIG. 5 is a simplified pictorial view showing the use of a cart according to the present invention to remove a purge tube and a purge tube ring from the vicinity of the pulling chamber of the crystal-growing machine.

The purge tube-engaging device 70 is then disengaged from the purge tube 30 and lowered within it until sufficient slack is available in the chain 54 to permit the receiver 56 to be disconnected from the connection fixture 58 of the purge tube-engaging device while the purge tube is supported on the deck 64 of the front end 38 of the cart 36. The hoist 52 can then be operated to retract the chain 54 and raise the receiver 56 until it is clear of the top of the pulling chamber 32 as shown in FIG. 5.

Once the purge tube parts have been removed as discussed above, the jack 40 can be disengaged from the floor 44 so that the cart 36 can be removed from its position adjacent the pulling chamber 32 to transport the purge tube ring 62, purge tube holding ring 72, and purge tube 30 to another location for cleaning and maintenance. When necessary cleaning has been accomplished within the pulling chamber 32 itself, the same or replacement parts can be reinstalled by performing the acts explained above in reverse order. Utilizing the method described herein-above, the purge tube, purge tube ring, and purge tube holding ring can be removed from and replaced in a pulling chamber 32 of sufficient size for use in growing crystals of larger sizes than have been grown commercially in the past, yet with relative safety to the personnel who must remove and replace the above-mentioned internal parts of such a pulling chamber 32.

Referring next in particular to FIGS. 6–8, the receiver 56 is attached to the chain 54 or other tension-bearing member 54, preferably through a helical spring 78 which allows a certain amount of effective elongation of the chain 54, limited by the length of a safety cable 80 arranged to carry the load in case the spring 78 should break during use. The chain 54 is attached by a suitable shackle, eye, or other conventional fastening device to a staple or bail 82 which is an uppermost part of the receiver 56. The receiver includes a top end piece 84, a pair of parallel upright side walls 86, and an upright rear wall 88. A cross member 90 extends laterally between the side walls 88 at the lower end of the receiver 56.

The two side walls 86 define a pair of parallel slots 92 located opposite each other and oriented so that an upper end 94 of each slot 92 is spaced farther apart from the rear wall 88 than is the lower end of each slot 92, as shown in FIG. 6. A latch pin 96 extends transversely between the side walls 86, with a respective end of the latch pin 96 extending through and being engaged in each of the slots 92. Suitable spring clips or other radially extending devices 98 may be attached to the latch pin 96 near each end to keep the latch pin 96 properly located in the slots 92, yet freely movable along the slots 92 between their upper ends 94 and their lower ends. Since the latch pin 96 is free to move along the slots 92, when the receiver 56 is suspended as from the chain 54 or other tension-bearing member attached to the staple 82 the latch pin 96 will normally be at the lower end of the slots 92.

When it is desired to connect the chain 54 to a device such as the purge tube ring removal tool 60 or the purge tube-engaging device 70, it is necessary merely to lower the receiver 56 over the upper end of the associated connection fixture 58 with the cross member 90 extending across a front face 100 of the connecting fixture 58. The front face 100 is inclined inwardly toward a back face 102 at an angle 103 of inclination substantially equal to the slope or angle 105 of the slots 92 with respect to the rear wall 88. An upper end 104 has a front face 106 that is separated from the back face 102 by a depth 107 that is greater than the separation between the lower ends of the slots 92 and the rear wall 88, so that there is not sufficient room for the upper end 104 of the connection fixture 58 to pass between the latch pin 96 and the rear wall 88 when the latch pin 96 is at the lower end of the slots 92. Accordingly, as the receiver 56 is lowered onto the upper end 104 of the connection fixture 58, the latch pin 96 is raised in the slots 92 until it reaches a position along the slots 92 nearer to the upper ends 94 of the slots 92, where the latch pin 96 is separated from the rear wall 88 far enough for the upper end front face 106 to pass between the latch pin 96 and the rear wall 88. As the receiver 56 is then lowered further along the connection fixture 58, the upper end front face 106 passes alongside the latch pin 96, and once this has occurred the latch pin 96 is again free to drop downward along the slots 92 toward their lower ends.

When the receiver 56 has been lowered along the connection fixture 58 as far as possible, so that the end 84 of the receiver rests atop the upper end 104 of the connection fixture 58 as shown in FIG. 7, an inclined ledge 108, which intersects with the front face 100 and extends outwardly and downwardly away from the back face 102, supports the latch pin 96, holding it above the bottom ends of the slots 92, as shown in FIG. 7.

Once the latch pin 96 has dropped downward beyond the upper end front face 106, upward movement of the receiver 56 with respect to the connection fixture 58 results in the front face 100 encountering the latch pin 98 so that by reaction the rear wall 88 is pulled toward the back face 102 and further upward movement of the receiver 56 is quickly limited as the portion of the connection fixture 58 above the latch pin 96 is held between the latch pin 96 and the rear wall 88. Because of the inclination of the slots 92, further movement of the receiver upward with respect to the connection fixture 58 urges the latch pin 96 further toward the front face 100, increasing the grip of the receiver upon the connection fixture 58. Once the receiver 56 is no longer being urged upward with respect to the connection fixture 58 as just described, however, this pressure of the latch pin 96 against the front face 100 is quickly relieved as the receiver 56 is permitted to move downward along the connection fixture 58. Preferably, to avoid any likelihood of jamming, the opposing inner surface of the rear wall 88 and the back face 102 are hard and smooth, and the inner surfaces of the slot 92 and the portions of the latch pin 96 which are supported by the slots 92 are also hard and smooth. The angle 105 between an inner surface of the slots 92 and the rear wall 88 is chosen to be substantially equal to the angle 103 between the corresponding surfaces of the connection fixture 58 to avoid having the latch pin 96 bind between the inner surfaces of the slots 92 and the front face 100, yet provides a secure grip of the receiver 56 on the connection fixture 58.

To disengage the receiver 56 from the connection device 58 all that is necessary is to lower the receiver 56 toward the position shown in FIG. 8 with respect to the connection fixture 58 and to raise the latch pin 96 toward the upper ends 94 of the slots 92. This permits the receiver 56 to be raised freely from the connection fixture 58 as soon as the latch pin 96 is separated from the rear wall 88 by a distance 109 greater than the depth 106.

As shown in FIG. 9, a carrier 110 includes a receiver 112 similar to the receiver 56 except that the staple 82 of the receiver 56 is replaced by a handle of conveniently gripped size and design such as the triangular loop handle 114 shown in FIG. 9, which should be of material and size appropriate to the loads to be engaged by such a carrier 110.

As shown in some detail in FIGS. 10, 11, and 12, the purge tube ring removal tool 60 includes a bottom 120 that may consist of three radial arms 122, joined at a central location. Each arm has a diagonally upwardly extending outer end 124 interconnected with a circular ring support member 126 whose diameter 128 is somewhat less than that of the purge tube ring 62 (FIGS. 1–5). When the purge tube ring 62 rests on the ring support 126, then, it is supported above a surface on which the purge tube ring removal tool 60 is resting.

At least a lower portion of each of the support legs 130 is also covered by a layer of heat-resistant material as with the ring support member 126. Each of a set of generally upwardly extending support members 130 is attached as by welding to a respective one of the radial arms 122 at a lower end, while an upper end of each is arcuately curved toward a central location where the upper ends of all the members 130 are interconnected with each other, and where a connection fixture 58 is also securely attached, so that the purge tube ring removal tool 60 can be engaged by the receiver 56.

Preferably, the height 132 of the support legs 130 is great enough so that the purge tube 30 can also be carried on the ring removal tool 60 or supported thereon during storage, along with the purge tube ring 62.

The ring support 126 is covered with a heat-resistant covering to protect the ring support member 126 of the purge tube ring removal tool 60 and to aid in avoiding contamination of the purge tube ring 62 and the furnace by material that might originate on the surface of the tool 60. A preferred material for the heat-resistant covering is a PTFE material, available from the DuPont Corporation, in the form of tubular sleeves which are attached to the ring support 126 and the support legs 130 during construction of the purge tube ring removal tool 60.

Figure 13:
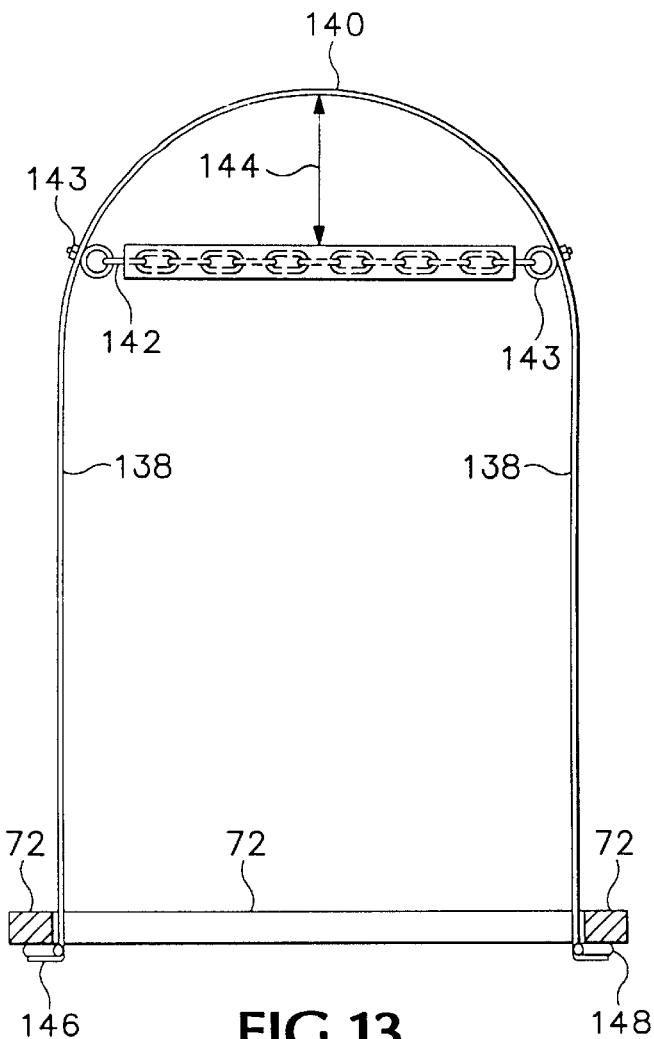
FIG. 13 is a front elevational view of a holding ring tool according to the present invention.
Figure 15:
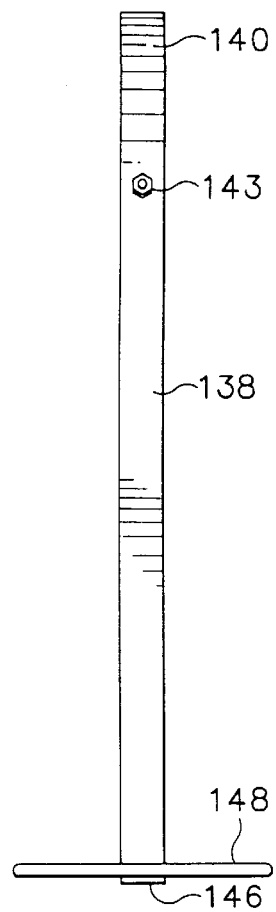
FIG. 15 is a side elevational view of the holding ring tool shown in FIGS. 13 and 14.
Figure 14:
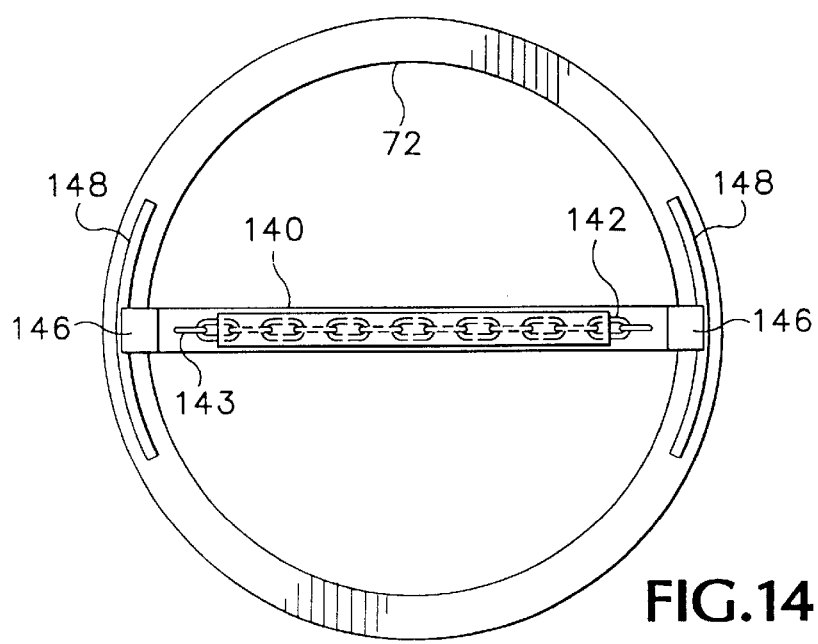
FIG. 14 is a bottom plan view of the holding ring tool shown in FIG. 13.

The purge tube holding ring removal tool 74, shown in FIGS. 13, 14, and 15, may be fashioned of a single metal strap defining a pair of generally parallel legs 138 and having an arcuate bow-like portion 140 of the strap material which is resiliently flexible and which interconnects upper ends of the legs 138. A flexible tension bearing member such as a chain 142 extends between opposite end portions of the bow-like portion 140, adjacent the upper ends of the legs 138, where it is attached by conventional fasteners such as eyebolts 143. The chain 142 is sufficiently tight so that deflecting the chain 142 more than a slight amount places the chain 142 under sufficient tension to urge the legs 138 toward each other causing the bow-like portion 140 to flex resiliently. Preferably, the location of the chain 142 or other tension-bearing member is spaced downwardly from the top of the bow-like connecting portion 140 by a distance 144 which is four or five inches, so that the ring removal tool 74 can be grasped with a user's hand around both the upper portion of the bow-like interconnecting portion 140 and a central portion of the chain 142 or similar tension bearing member to deflect the chain 142 and bring the legs 138 temporarily toward each other.

At the lower end of each leg 138 is a radially outwardly extending foot 146, which may be an extension of the strap material forming the legs 138. An arcuately curved rod 148 of suitable material such as stainless steel is welded to each of the feet 146 and has a radius of curvature corresponding to the inner surface of the purge tube holding ring to be removed using the tool 74.

Once the legs 138 have been moved closer together and moved through the interior of an annular device such as the purge tube holding ring 72, the user's grip on the bow 140 and chain 142 is loosened. The elastic bias of the upper arcuate portion 140 urges the legs 138 again outwardly to the normal configuration shown in FIG. 13, carrying the stainless steel rods 148 to a position beneath the purge tube holding ring 72. Thus supported, the purge tube holding ring can easily be removed from the supporting structure within the pulling chamber 32 through an access opening provided by opening the door 76 on the side of the pulling chamber, so that there will thereafter be clearance for the purge tube 30 to be lowered as discussed above.

The specialized cart 36 according to the present invention is shown in greater detail in FIGS. 16, 17, 18, and 19, where it may be seen that the cart includes a pair of side rails 152 mounted above the deck 64 adjacent the rear end 42. Between the side rails 152 are a set of three steps 156 on which an operator can climb to a greater height for convenience in removing the purge tube 30 and other parts from the pulling chamber 32. Preferably, each side rail 152 includes a front support post 158 located on the cart where the support posts 158 can be placed in contact with an outer rim 159 or equivalent structure of the pulling chamber 32 when the pulling chamber 32 is in the service position shown in FIGS. 1–5, so that the part of the deck 64 near the front end 138 of the cart is appropriately located beneath the pulling chamber 32.

In the arrangement of the crystal-growing machine shown in FIGS. 1–5 a floor 160 surrounding the furnace of the crystal-growing machine is depressed with respect to the floor 44 on which the cart 36 is located, and a pair of middle wheels 162 are mounted on the cart in a position that will locate them safely on the upper floor 44 in a location minimizing the amount of the front end portion 38 of the cart which extends beyond the edge of the floor 44 above the floor 160. The middle wheels 162 are preferably mounted to rotate in a fixed plane with respect to the deck 154 of the cart 36. At each of the front end 38 and rear end 42 of the cart, however, a respective pair of caster wheels 164 are free to swivel about respective vertical caster pivot axes 166 to permit the cart to be steered easily as it is moved about, as shown schematically in FIG. 19. The floor jack 40 mounted to the underside of the deck 154 at the rear end 42 of the cart, can be pushed down to engage the floor in which the cart is supported to prevent the rear end 42 of the cart from moving with respect to the floor at that location, thus acting also as a brake to retain the cart in the required position during removal or replacement of parts of the pulling chamber 32 as described above.

Figure 20:
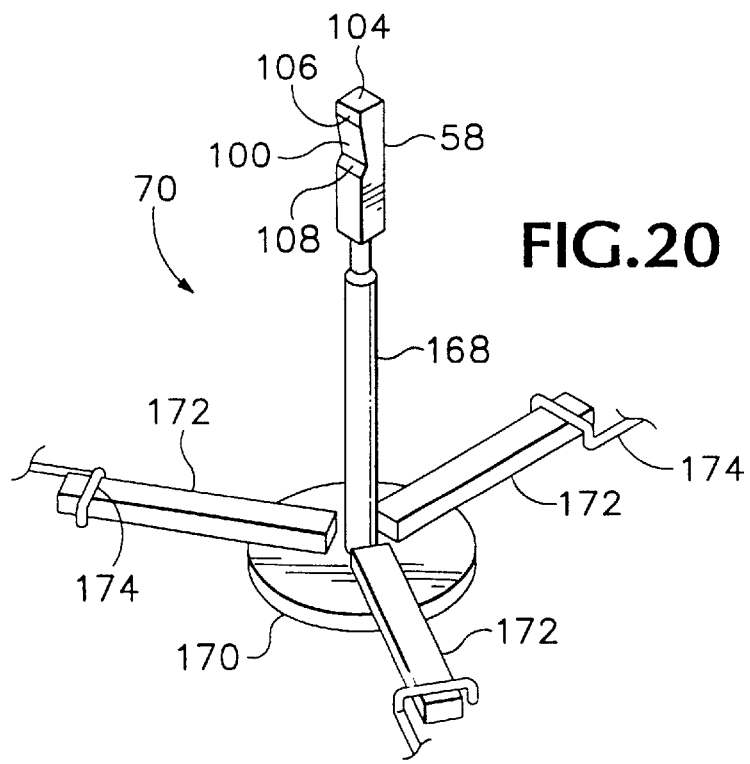
FIG. 20 is a perspective view of a purge tube-engaging device according to the present invention.
Figure 21:
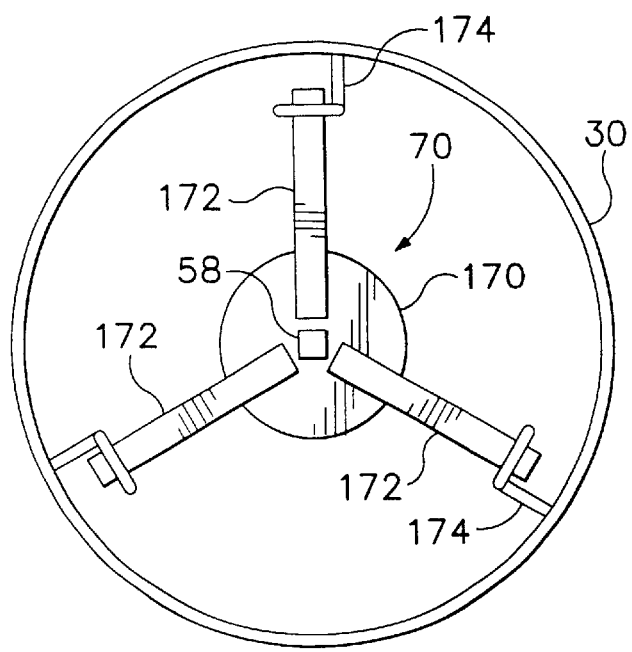
FIG. 21 is a top view of a purge tube of a semiconductor crystal-growing machine with the purge tube-engaging device shown in FIG. 20 engaged with the purge tube.

In FIGS. 20 and 21 is shown the previously-mentioned purge tube-engaging device 70, which in a preferred embodiment includes a centrally located upright shaft portion 168, a base support disc 170, and three equally-spaced horizontal radially-extending legs 172 of the appropriate size to engage lifting brackets included in the structure of the purge tube 30 and located near an upper end of the purge tube 30. A connection fixture 58 is attached to the upper end of the central shaft 168 so that the chain 54 can be attached to the purge tube-engaging device 70 to raise and lower the device and the purge tube to which it is connected. As shown in FIGS. 20 and 21 the purge tube-engaging device is engaged with a purge tube 30 by rotating the device 70 to bring each of the legs 172 into an engagement position against a respective support bracket 174 in the purge tube 30.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of assembling portions of a pulling chamber of a semiconductor crystal growing machine, comprising:

(a) lowering a tension-bearing member to extend within and through at least a part of a pulling chamber and through a purge tube located below said pulling chamber;

(b) attaching said tension-bearing member to a purge tube-engaging device;

(c) raising said tension-bearing member and thereby carrying said purge tube upon said purge tube-engaging device; and (d) raising said tension-bearing member and thereby raising said purge tube into a desired position within said pulling chamber.

2. A method of claim 1, further including attaching said tension-bearing member to a purge tube ring removal tool, raising said tool into engagement with a purge tube ring; raising said tension-bearing member and thereby raising said purge tube ring into a required location with respect to said purge tube; and fastening said purge tube ring in place inside said pulling chamber.

3. The method of claim 1 wherein raising the purge tube into a desired position within the pulling chamber comprises raising the purge tube to an elevated position within the pulling chamber above an operational position of the purge tube, and wherein the method further comprises installing the purge tube, and installing a purge tube holding ring within the pulling chamber while the purge tube is in the elevated position.

4. The method of claim 3 wherein installing said purge tube further comprises lowering the purge tube from the elevated position and into contact with the purge tube holding ring such that the purge tube is thereafter held in the operational position by the purge tube holding ring.

5. The method of claim 4 further comprising disengaging the purge tube-engaging member from the purge tube once the purge tube is in contact with the purge tube holding ring.

6. The method of claim 3 wherein installing the purge tube holding ring comprises: attaching a purge tube holding ring removal tool to the purge tube holding ring; manipulating the purge tube holding ring removal tool to place the purge tube holding ring within the pulling chamber; and detaching the purge tube holding ring removal tool from the purge tube holding ring.

\* \* \* \* \*